US006653894B2

(12) United States Patent
Botker (10) Patent No.: US 6,653,894 B2
(45) Date of Patent: Nov. 25, 2003

(54) INTEGRATED CURRENT MIRROR IN OUTPUT STAGE OF OPERATIONAL AMPLIFIER

(76) Inventor: Thomas L. Botker, 8451 E. Colette St., Tucson, AZ (US) 85710

( * ) Notice: Subject to any disclaimer, the term of this patent is extended or adjusted under 35 U.S.C. 154(b) by 0 days.

(21) Appl. No.: 10/125,971

(22) Filed: Apr. 18, 2002

(65) Prior Publication Data

US 2003/0197555 A1 Oct. 23, 2003

(51) Int. Cl.[7] .............................................. H03F 1/02
(52) U.S. Cl. ......................... 330/9; 330/255; 330/257
(58) Field of Search ............................. 330/9, 253, 255, 330/257, 258, 261, 288, 290

(56) References Cited

U.S. PATENT DOCUMENTS 5,512,859 A * 4/1996 Moraveji ..................... 330/267
5,515,005 A * 5/1996 Yoshioka ..................... 330/255
6,236,270 B1 * 5/2001 Takeuchi ..................... 330/253

OTHER PUBLICATIONS

Toumazou, C. and Lidgey, F. J., "Novel Current–Mode Instrumentaion Amplifier," Electronics Letters Feb. 2, 1989, vol. 25, No. 3, pp 228–230.

Texas Instruments, "microPower, Single–Supply, CMOS Instrumentation Amplifier," Dec. 2000, pp 1–14.

* cited by examiner

Primary Examiner—Henry Choe
(74) Attorney, Agent, or Firm—Ohlandt, Greeley, Ruggiero & Perle, L.L.P.

(57) ABSTRACT

A current mirror configuration can be integrated in the output stage of an operational amplifier that enables rail-to-rail performance without requiring a significant increase in headroom. The operational amplifier can be configured with a chopper stabilized current mirror configured within the output stage of the operational amplifier. Through use of the integrated current mirror in the output stage of the amplifier, the substrate of the integrated circuit can be suitably grounded to minimize noise problems. To obtain rail-to-rail output performance, the operational amplifier can incorporate a positive and negative charge pump. However, rather than requiring the negative charge pump to charge pump the operational amplifier negative for a full $V_{GS}$ voltage, such as in a conventional current mirror, the integrated current mirror requires minimal headroom for implementation with the operational amplifier. For example, the current mirror enables the charge pump to only charge pump the operational amplifier negative by approximately ½ $V_{BE}$ voltage so that the NMOS source-drain diffusions are not forward-biased to the grounded substrate.

20 Claims, 4 Drawing Sheets

INTEGRATED CURRENT MIRROR IN OUTPUT STAGE OF OPERATIONAL AMPLIFIER

FIELD OF INVENTION

The present invention relates to operational amplifiers and other mixed signal circuits. More particularly, the present invention relates to an integrated current mirror circuit and technique for facilitating improved rail-to-rail performance in operational amplifier circuits while providing excellent DC characteristics.

BACKGROUND OF THE INVENTION

The demand for improved operational amplifiers, and in particular instrumentation amplifier circuits for high-precision data acquisition and instrumentation applications, such as multi-channel data acquisition systems, current shunt monitors, and industrial or physiological sensors, continues to increase. Instrumentation amplifier circuits are generally designed to amplify the difference between two voltage inputs with a defined gain, wherein a single-ended output is provided which is referenced to a known reference point, for example, ground.

Figure 1:
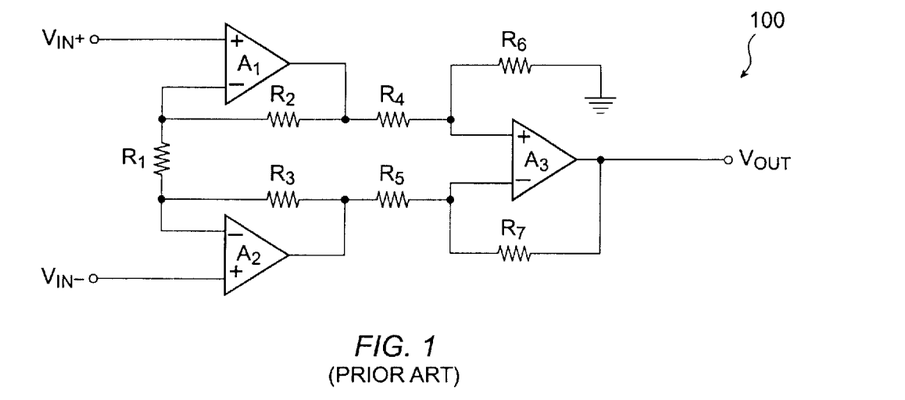
FIG. 1 illustrates a schematic diagram of a prior art three op amp instrumentation amplifier.

There are a variety of instrumentation amplifier circuits available today. One conventional instrumentation amplifier comprises three op-amps as illustrated in FIG. 1. Buffers $A_1$ and $A_2$ are configured to receive a differential input voltage $V_{IN}$, i.e., the difference between input voltages $V_{IN}+$ and $V_{IN}-$, at the positive input terminals of amplifiers $A_1$ and $A_2$, and which are configured with resistors $R_1$ through $R_3$ to provide a buffered signal to a third amplifier $A_3$. For example, the outputs of amplifiers $A_1$ and $A_2$ are applied as an input to a third op amp, $A_3$, configured as a difference amplifier, and coupled to resistors R4–R7. As a result, the differential voltage can be buffered through amplifier A3 to the output terminal VOUT.

Figure 2:
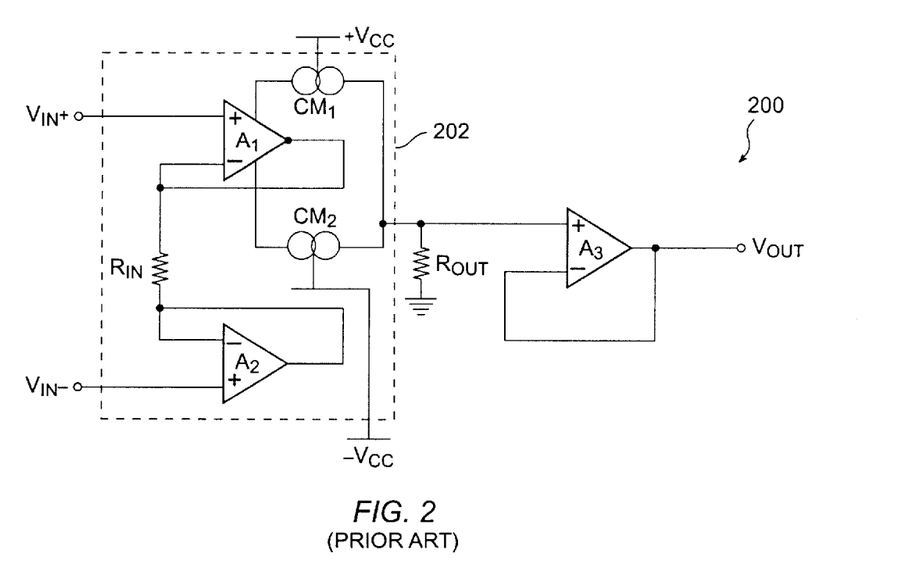
FIG. 2 illustrates a schematic diagram of another prior art three op amp instrumentation amplifier.

Another approach for an instrumentation amplifier with current mirrors is disclosed by Toumazou and Lidgey in "Novel Current-Mode Instrumentation Amplifier", *Electronics Letters*, Vol. 25 No. 3, Feb. 2, 1989, and is illustrated in FIG. 2. Instrumentation amplifier 200 comprises a pair of current mirrors $CM_1$ and $CM_2$ which are configured to mirror the supply currents from both the op amp and the output stage circuit of unity gain buffer $A_1$, the $V_{IN}+$unity gain buffer. Again, only the difference in supply currents, $V_{IN}/R_{IN}$, flows out of the output of current mirrors $CM_1$ and $CM_2$ and into resistor $R_{OUT}$. As a result, a voltage is developed equal to $V_{IN} \times (R_{OUT}/R_{IN})$ that can be buffered through unity gain buffer $A_3$ to the output terminal $V_{OUT}$.

While the above instrumentation amplifier configurations can provide good DC common mode rejection, such instrumentation amplifiers have great difficulty in providing a for good rail-to-rail voltage swing capability for input and output stages. While it would be highly desirable if these instrumentation amplifiers could provide rail-to-rail voltage swing capabilities, currently available instrumentation amplifiers cannot suitably provide true rail-to-rail voltage swing due to their operating characteristics.

Current mirrors, like those of FIG. 2, can affect the ability of amplifier circuits to realize optimum rail-to-rail output performance because those current mirrors require significant headroom. A current mirror typically allows the input current to flow through a gate-drain connected device, i.e., a diode-connected device. This input current results in a voltage from gate to source $V_{GS}$ that can be applied across a second device that replicates the input current. For example, with reference to FIG. 4, a current mirror 400 is illustrated and which comprises transistors $M_1$ and $M_2$, with transistor $M_1$ configured in a diode-manner, i.e., with a gate-to-drain connection. Current mirror 400 is configured such that as a current I flows through transistor $M_1$, a gate-source voltage $V_{GS}$ results that can be applied across transistor $M_2$, thus replicating the current I to flow out of transistor $M_2$ if the devices are perfectly matched.

Figure 4:
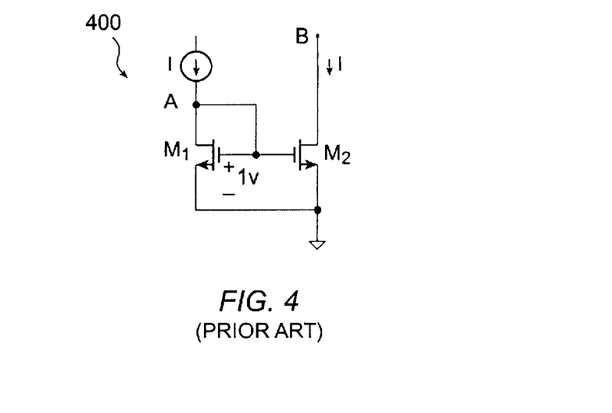
FIG. 4 illustrates a schematic diagram of a prior art current mirror configuration.

To facilitate matching devices $M_1$ and $M_2$, it is desirable that the voltage at node A is equal to the voltage at node B. Thus, for applications with gate-source voltage $V_{GS}$ equal to one volt at node A to facilitate good matching or accurate current mirroring, for example, node B is also required to be equal to one volt. However, at a gate-source voltage $V_{GS}$ equal to one volt at transistor $M_1$, forward-biasing of the source-to-substrate diode junctions within transistors $M_1$ and $M_2$ can occur when the substrate is grounded and when charge pumping the sources of transistors $M_1$ and $M_2$ negative. On the other hand, when charge pumping transistors $M_1$ and $M_2$ and the substrate negative, noise can be coupled back into the body of all the NMOS devices on the integrated circuit. Unfortunately, to minimize the effects of forward-biasing of the source-to-substrate diode junctions, a limited amount of negative charge pump voltage can be applied to the sources of transistors $M_1$ and $M_2$ which results in limited headroom being available. Moreover, to provide for an output of zero volts, e.g., to provide the output at ground, the sources of transistors $M_1$ and $M_2$ would operate at −1 volt, again resulting in a forward-biasing of the substrate-to-source diode junction on the NMOS devices of current mirror 400.

Accordingly, a need exists for a circuit having a current mirror configuration that can enable an amplifier circuit to realize improved rail-to-rail swing capabilities. In addition, a need exists for a current mirror configuration capable of being implemented within a single-well process having limited voltage headroom requirements.

SUMMARY OF THE INVENTION

The method and circuit according to the present invention addresses many of the shortcomings of the prior art. In accordance with one aspect of the present invention, an improved current mirror configuration can be integrated in the output stage of an operational amplifier that enables improved rail-to-rail performance of the amplifier.

In accordance with an exemplary embodiment, an operational amplifier can be configured with a current mirror configured within the output stage of the operational amplifier. Further, through use of the current mirror configured in a feedback arrangement within the amplifier, the substrate of the integrated circuit can be suitably grounded to minimize noise problems. For example on a single n-well process, less drain-source $V_{DS}$ voltage on the input and output side of the integrated current mirror is required to obtain improved rail-to-rail output performance.

To facilitate the obtaining of rail-to-rail output performance, the operational amplifier can also incorporate a positive and a negative charge pump. However, instead of requiring the negative charge pump to charge pump the current mirror negative a full $V_{GS}$ voltage, the current mirror requires minimal headroom, e.g., approximately $V_{DSAT}$, for implementation with the operational amplifier. For example, the integrated current mirror enables the charge pump to only charge pump the current mirror negative by approximately ⅓ $V_{GS}$ voltage so that the NMOS source-to-substrate junctions are not forward-biased to the grounded substrate. As a result, the current mirror requires less drain-source $V_{DS}$ voltage to obtain full rail-to-rail output performance while allowing the substrate to remain grounded such that noise from the charge pump, which might otherwise charge pump the sources of the current mirror as well as the substrate, will not couple into other NMOS devices or the integrated circuit through a back body effect.

In accordance with another exemplary embodiment, the current mirror can be configured with chopper stabilization to facilitate reduction of mismatch errors within the transistor devices of the current mirror.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components and various processing steps. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any integrated circuit application. Such general applications that may be appreciated by those skilled in the art in light of the present disclosure are not described in detail herein. However for purposes of illustration only, exemplary embodiments of the present invention will be described herein in connection with a current mirror for use with an operational amplifier. Further, it should be noted that while various components may be suitably coupled or connected to other components within exemplary circuits, such connections and couplings can be realized by direct connection between components, or by connection through other components and devices located therebetween.

Figure 6:
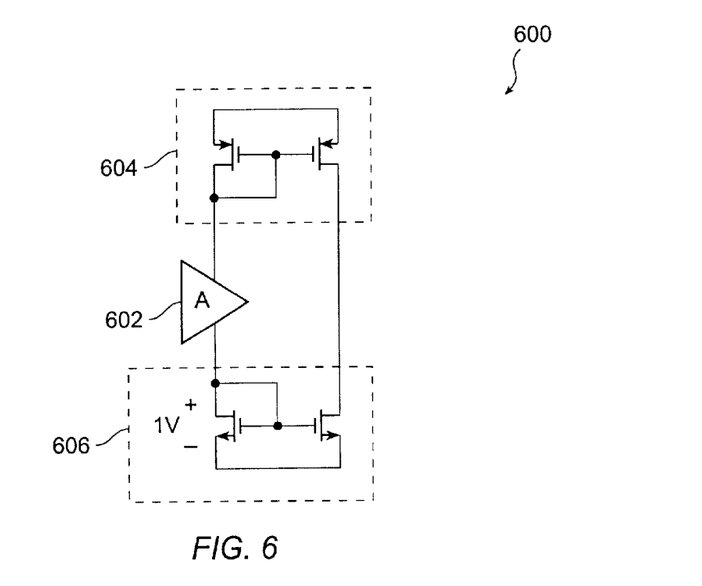
FIG. 6 illustrates a schematic diagram of a prior art operational amplifier circuit with current mirrors.
Figure 7:
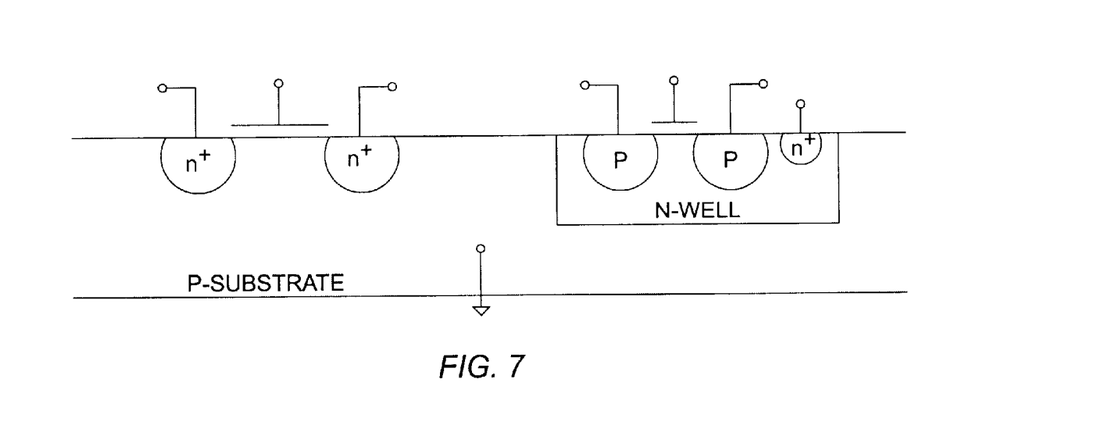
FIG. 7 illustrates another schematic diagram of an exemplary integrated circuit having NMOS and PMOS devices in accordance with the present invention.

As discussed above, prior art current mirror configurations for use with operational amplifiers have great difficulty in providing true rail-to-rail performance, because almost a full gate-source voltage $V_{GS}$ is required, such as illustrated with reference to the operational amplifier and current mirror configuration of FIG. 6. However, use of such prior art current mirror configurations also have various deficiencies when charge pumping an amplifier circuit.

In an attempt to overcome the above deficiencies, a negative charge pump may be implemented to enable the current mirror to be charge pumped negative for a fraction of a forward bias diode-junction. For example with reference to FIG. 3, an NMOS device can be configured to allow the source of the NMOS device to be charge pumped negative for a fraction of the negative 0.6 or 0.7 volts of the n+ substrate diode junction.

Figure 3:
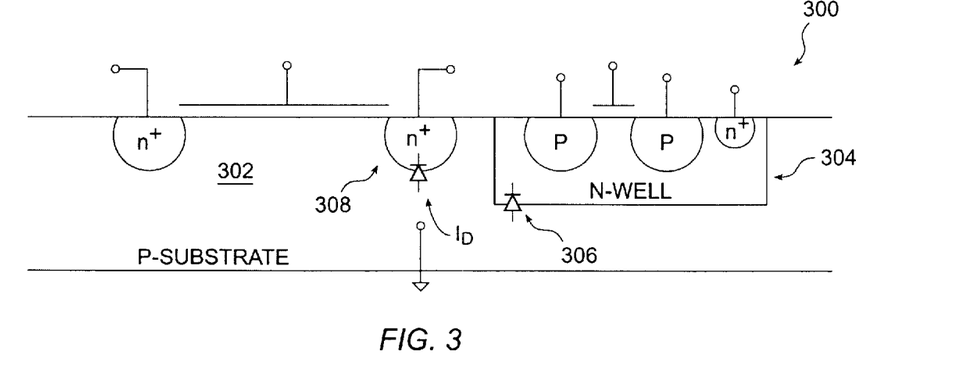
FIG. 3 illustrates a schematic diagram of an exemplary integrated circuit having NMOS and PMOS devices in accordance with the present invention.

In single-well processes, which are less expensive than double-well processes, it can be desirable to ground the entire p-substrate. This grounding of the substrate enables the substrate to operate as a low noise, back body for all of the NMOS devices 302 on the integrated circuit. While the PMOS device 304 is configured within the n-well, and thus isolated in the substrate by the diode junction 306, the NMOS device is directly sitting within the p-substrate. Since the NMOS device 302 is configured within the p-substrate, by charge pumping negative the p-substrate and/or the source of NMOS device 302, any noise within the p-substrate can unfortunately couple back into the body of any NMOS device, and thus modulate the drain current.

However, by applying a negative charge pump to the source of the NMOS device and grounding the substrate, the junction of diode configuration 308 becomes forward-biased, causing current $I_D$ to flow through diode configuration 308, which can cause performance issues and potential latch-up issues.

Accordingly, to prevent the diodes from turning "on", only a fraction of the voltage $V_{BE}$ is charge pumped, e.g., to approximately −0.375 volts. However, it is difficult to get the current mirror to properly operate with such limited headroom of between −0.375 and ground, i.e., due to required negative swing of the amplifier. However, in accordance with various aspects of the present invention, an improved current mirror configuration can be provided in the output stage of an operational amplifier that enables rail-to-rail performance without requiring a significant increase in headroom for the current mirror operation.

In accordance with an exemplary embodiment, an operational amplifier can be configured with a chopper stabilized current mirror configured within the output stage of the operational amplifier. In accordance with the exemplary embodiment, through use of the chopper stabilized current mirror configured in the main signal path of the amplifier, the substrate of the integrated circuit can be suitably grounded to minimize noise problems which could result from charge pumping the whole substrate. To obtain rail-to-rail input and output performance, the operational amplifier can incorporate a positive and a negative charge pump. However, rather than requiring the negative charge pump to charge pump the operational amplifier negative for a full $V_{GS}$ voltage, such as when charge pumping the whole substrate to provide the required additional headroom, the current mirror requires minimal headroom for implementation within the operational amplifier. For example, the current mirror enables the charge pump to only charge pump the current mirror negative by approximately ½ $V_{BE}$ voltage, i.e., the substrate and n+ source junction, so that neither of the NMOS source-drain diffusions are forward-biased to the grounded substrate. As a result, the current mirror requires less $V_{DS}$ voltage to allow the operational amplifier to obtain full rail-to-rail output performance.

Figure 5:
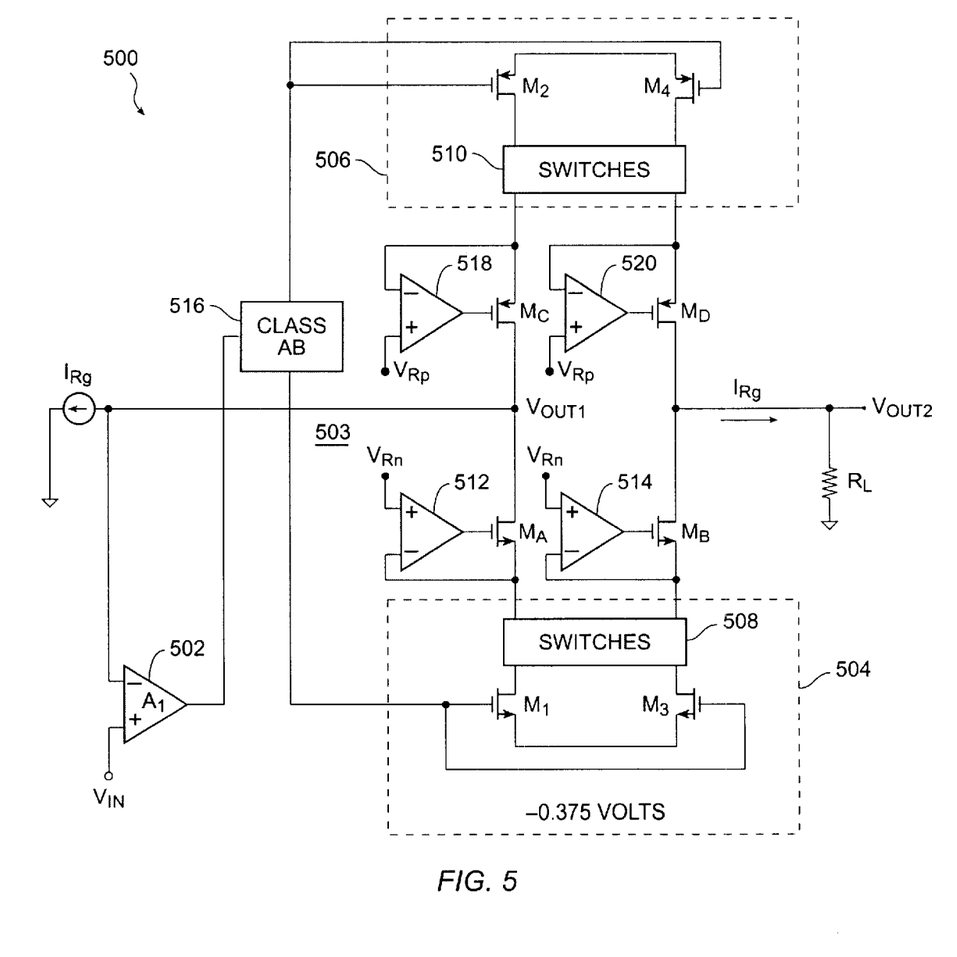
FIG. 5 illustrates a schematic diagram of an exemplary embodiment of an operational amplifier with an integrated current mirror in accordance with the present invention.

With reference to FIG. 5, an exemplary operational amplifier circuit 500 is illustrated. Circuit 500 suitably comprises an amplifier 503 and a pair of integrated current mirror circuits 504 and 506. Amplifier 503 suitably comprises a gain stage 502 and output devices configured within a portion of current mirror circuits 504 and 506. A current source $I_{Rg}$ can be provided for the input of amplifier 503. Current source $I_{Rg}$ suitably comprises any conventional current source circuit for providing a fixed current reference, or any other current source configuration, or any device for providing a current to be mirrored.

Gain stage 502 suitably comprises any amplifier configuration configured for receiving an input signal and providing an output signal. In accordance with an exemplary embodiment, gain stage 502 can comprise a chopper stabilized amplifier, such as the amplifier configurations disclosed in U.S. patent application Ser. No. 10/123,981 filed on Apr. 16, 2002, entitled "Residual Offset Correction Method And Circuit For Chopper Stabilized Amplifiers," having common inventor and assignee as this application, and incorporated herein by reference. Further, gain stage 502 can comprise a differential amplifier having a positive and negative input terminal. However, in accordance with other exemplary embodiments of the present invention, various other amplifier configurations can also be implemented.

In addition, amplifier 503 includes output devices configured within current mirror circuits 504 and 506, i.e., as will be explained below in greater detail, transistor devices $M_1$ and $M_2$, and/or transistor devices $M_3$ and $M_4$ can comprise output devices to amplifier 503.

In accordance with an exemplary embodiment, amplifier 503 also includes an output biasing network 516 coupled in between the output of gain stage 502 and the gates of transistors $M_1$ through $M_4$ of current mirror 504 and 506. Output biasing network 516 is suitably configured to provide biasing to the output of amplifier 503. Preferably, output biasing network 516 comprises class AB biasing; however, other biasing configurations can be utilized.

Current mirror circuit 504 suitably comprises a pair of transistors $M_1$ and $M_3$ suitably configured to mirror the output current flowing from the output of amplifier 503, e.g., from an output device comprising $M_1$ or $M_3$. Transistors $M_1$ and $M_3$ are suitably configured with their gates coupled to the output of gain stage 502 through class AB device 516, and with their sources connected together, i.e., the source of transistor $M_1$ is connected to the source of transistor $M_3$.

Current mirror circuit 506 suitably comprises a pair of transistors $M_2$ and $M_4$ suitably configured to mirror the output current flowing from the output of amplifier 503, e.g., from an output device comprising $M_2$ or $M_4$. Transistors $M_2$ and $M_4$ are suitably configured with their gates coupled to the output of gain stage 502 through class AB device 516, and with their sources connected together, i.e., the source of transistor $M_2$ is connected to the source of transistor $M_4$.

In accordance with an exemplary embodiment, operational amplifier circuit 500 can also be configured with cascode devices $M_A$ and $M_B$ and cascode devices $M_C$ and $M_D$ to address output impedance differences between transistors $M_1$ and $M_3$ and transistors $M_2$ and $M_4$, respectively. Cascode devices $M_A$ and $M_B$ and cascode devices $M_C$ and $M_D$ can be suitably coupled to transistors $M_1$ and $M_3$ and transistors $M_2$ and $M_4$, respectively, of current mirror 504 and 506 in an interchanging manner as discussed further below. In addition, cascode devices $M_A$ and $M_C$ are configured to facilitate coupling of current mirror circuits 504 and 506 in a feedback arrangement with amplifier 502, e.g., by coupling the drains of cascode devices $M_A$ and $M_C$ to the inverting input terminal of amplifier 502. Further, cascode devices $M_B$ and $M_D$ are configured to facilitate coupling of current mirror circuits 504 and 506 to output load device $R_{LOAD}$. It should also be noted the operation of cascode devices $M_C$ and $M_D$ is substantially similar to cascode devices $M_A$ and $M_B$, thus a discussion of operation of one cascode pair applies substantially equally to the other pair of cascode devices.

Cascode devices $M_A$ and $M_B$ and cascode devices $M_C$ and $M_D$ are suitably configured to force the voltage across transistors $M_1$ and $M_3$ and transistors $M_2$ and $M_4$, respectively, to be approximately equal and substantially constant. For example, in an application without the utilization of cascode devices $M_A$ through $M_D$, wherein the non-inverting input terminal of gain stage 502 is grounded, the output of amplifier 503, e.g., the drains of transistor $M_1$ and $M_2$, is at zero volts, and a one milliamp (1 mA) $I_{RG}$ signal flows out of transistor $M_4$ to resistor $R_{LOAD}$ having a resistance value of 2 kΩ, the output voltage $V_{OUT2}$ would be equal to two volts. As a result, a different voltage could exist across transistors $M_1$ and $M_3$ and transistors $M_2$ and $M_4$, and thus transistors $M_1$ and $M_3$ and transistors $M_2$ and $M_4$ will not properly match, resulting in a less than optimum current mirror.

However, through implementation of cascode devices $M_A$ and $M_B$ and cascode devices $M_C$ and $M_D$, the voltages across transistors $M_1$ and $M_3$ and transistors $M_2$ and $M_4$, respectively, can be forced to approximately equal. To facilitate operation of cascode devices $M_A$ through $M_D$, in accordance with an exemplary embodiment, cascode devices $M_A$ and $M_B$ are suitably configured with amplifier devices 512 and 514, respectively. Meanwhile, cascode devices $M_C$ and $M_D$ can be suitably configured with amplifier devices 518 and 520, respectively. Amplifier devices 512, 514, 518 and 520 are suitably configured to drive the sources of each of cascode devices $M_A$ and $M_B$ and cascode devices $M_C$ and $M_D$ to a respective reference voltage $V_{Rn}$ and $V_{Rp}$. For example, the output of amplifier devices 512, 514, 518 and 520 can be suitably coupled to the gates of cascode devices $M_A$, $M_B$, $M_C$ and $M_D$, respectively, and the sources of cascode devices $M_A$, $M_B$, $M_C$ and $M_D$ can be coupled to the inverting input terminal of amplifier devices 512, 514, 518 and 520, respectively. As a result of the operation of cascode devices $M_A$, $M_B$, $M_C$ and $M_D$, the voltages across each of transistors $M_1$ and $M_3$ and transistors $M_2$ and $M_4$ can be forced to approximately equal, independent of the value of current source $I_{Rg}$ or other input current.

In addition to the mismatch addressed by cascode devices $M_A$ and $M_B$ and cascode devices $M_C$ and $M_D$, operational amplifier circuit 500 can also be configured to address errors caused by mismatch existing between transistors $M_1$ and $M_3$ and between transistors $M_2$ and $M_4$, respectively. In accordance with this aspect of the present invention, transistors $M_1$ and $M_3$ and transistors $M_2$ and $M_4$ can be chopper stabilized to significantly reduce mismatch errors.

In accordance with an exemplary embodiment, to facilitate chopper stabilization of current mirror circuits 504 and 506, transistors $M_1$ and $M_3$ can be configured with switch network 508, while transistors $M_2$ and $M_4$ can be configured with switch network 510, to provide for chopper stabilization. Switch network 508 and 510 can suitably comprise various types of switching devices, such as transistors, e.g., MOSFET or JFET devices. Switch network 508 is suitably arranged to couple together transistors $M_1$ and $M_3$ to cascode devices $M_A$ and $M_B$ to facilitate the chopper stabilization, e.g., switch network 508 is alternately coupled in between transistors $M_1$ and $M_3$ and cascode devices $M_A$ and $M_B$. Meanwhile, switch network 510 is suitably arranged to couple together transistors $M_2$ and $M_4$ to cascode devices $M_C$ and $M_D$ to facilitate the chopper stabilization, e.g., switch network 510 is alternately coupled in between transistors $M_2$ and $M_4$ and cascode devices $M_C$ and $M_D$.

For example, for an approximately 50/50 duty cycle application (for a 1:1 current mirror), during a phase one, switch network 508 is suitably configured such that transistor $M_1$ is coupled to cascode device $M_A$ and transistor $M_3$ is coupled to cascode device $M_B$, while switch network 510 is suitably configured such that transistor $M_2$ is coupled to cascode device $M_C$ and transistor $M_4$ is coupled to cascode device $M_D$. As a result, transistors $M_1$ and $M_2$ become the output devices for amplifier 503, i.e., transistors $M_1$ and $M_2$ are configured to drive the output $V_{OUT1}$, which is coupled back to the inverting terminal of amplifier 503 to complete a feedback configuration. Meanwhile, transistors $M_3$ and $M_4$ comprise mirroring devices configured to mirror the input signal to drive the output $V_{OUT2}$, i.e., to drive the load device $R_{LOAD}$.

During a phase two, switch network 508 is suitably configured such that transistor $M_1$ is coupled to cascode device $M_B$ and transistor $M_3$ is coupled to cascode device $M_A$, while switch network 510 is suitably configured such that transistor $M_2$ is coupled to cascode device $M_D$ and transistor $M_4$ is coupled to cascode device $M_C$. Thus, transistors $M_3$ and $M_4$ become output devices for amplifier 503, i.e., transistors $M_3$ and $M_4$ are configured to drive the output $V_{OUT1}$ and complete the feedback configuration with amplifier 503, while transistors $M_1$ and $M_2$ suitably comprise the mirroring devices to provide the output current through cascode devices $M_B$ and $M_D$ to drive the output $V_{OUT2}$, i.e., to provide output current to drive load device $R_{LOAD}$. Accordingly, through the interchanging of the connections between transistors $M_1$ and $M_3$ and cascode devices $M_A$ and $M_B$, as well as the interchanging of the connections between transistors $M_2$ and $M_4$ and cascode devices $M_C$ and $M_D$, i.e., through the chopper stabilization of transistors $M_1$ through $M_4$, operational amplifier circuit 500 can achieve the further minimization and/or reduction of mismatch errors between transistors $M_1$ and $M_3$ and transistors $M_2$ and $M_4$, respectively, such as for a 50/50 duty cycle application.

Thus, for an example with the non-inverting input terminal of amplifier 502 grounded, during a phase one of a 50/50 duty cycle application, the output $V_{OUT1}$ will be driven to zero volts through the feedback configuration including transistors $M_1$ and $M_2$, while transistors $M_3$ and $M_4$ suitably provide current to load device $R_{LOAD}$. When the input current from current source $I_{Rg}$ is at zero, the current within transistors $M_1$ and $M_2$ can comprise 50 µA. As the current from current source $I_{Rg}$ increases, such as to 10 µA, a nonlinear offset between the currents in transistors can occur due to effects of class AB biasing current, e.g., with the current within transistor $M_2$ might comprise approximately 56 µA, and with the current within transistor, $M_1$ might comprise approximately 46 µA., which is a 10 µA offset. Since, non-linear values result within the currents in transistors $M_1$ and $M_2$, i.e., the current, being mirrored from transistors $M_3$ and $M_4$ through cascode devices $M_B$ and $M_D$, comprises the same class AB biasing resulting in an output current equal to $I_{Rg}$, comprising 10 µA. Similarly, during the second phase, as switch networks 508 and 510 operate to switch transistors $M_1$ through $M_4$ with cascode devices $M_A$ through $M_D$, the class AB non-linearities can be suitably canceled out, i.e., the output stage DC biasing does not result in an output signal.

In addition to the above exemplary embodiments that are configured to address various mismatch errors, in accordance with another exemplary embodiment, operational amplifier circuit 500 can also be suitably configured to address problems with differential mode signal created by common mode input signals, such as those that may exist with respect to an operational amplifier 200. In accordance with this exemplary embodiment, multiple amplifiers 500 can also be suitably configured with current mirrors 504 and 506 configured to cancel out the differential mode signal created by common mode input signals. For example, with reference to U.S. patent application Ser. No. 09/790,951, filed Feb. 22, 2001, and entitled "Instrumentation Amplifier", having a common assignee as the present application, and incorporated herein by reference, an operational amplifier circuit is disclosed that provides for the cancellation of the differential mode signal created by common mode input signals. As a result, the detrimental effects of the common mode signals can be suitably canceled out, allowing only differential current to be suitably provided to load resistance $R_{LOAD}$.

As discussed above, for single-well processes, it is desirable to ground the substrate which acts as a back body for all the NMOS devices on the integrated circuit. However, with a high level of gate-source voltage $V_{GS}$, such as required in FIG. 6, the substrate diode junction of the NMOS device can become forward biased if the substrate is grounded. Using lower levels of voltage leaves insufficient headroom for simpler current mirror configurations such as illustrated in FIG. 6, to properly operate if maximum output swing is desired.

In accordance with another aspect of the present invention, the topology of operational amplifier circuit 500 allows an inexpensive single well process to be utilized when limited headroom is available, e.g., when the substrate is grounded. As discussed above, the current mirror enables the negative charge pump to only charge pump the operational amplifier output stage negative by approximately ½ $V_{BE}$ voltage, e.g., to −0.375 volts. This provides a voltage low enough such that the output stage NMOS source-drain diffusions are not forward-biased to the grounded substrate, thus the grounded substrate prevents injection of any charge pump noise through the back gates of any NMOS devices.

However, as a result of the various devices implemented within operational amplifier circuit 500, e.g., current mirrors 504 and 506, switch networks 508 and 510, cascode devices $M_A$ and $M_B$ and cascode devices $M_C$ and $M_D$, amplifiers 512, 514, 518 and 520, operational amplifier circuit 500 must be configured with sufficient headroom to permit these devices to properly operate. One solution could include the external implementation of the current mirrors to the output stage of an amplifier, for example as illustrated in FIG. 6 with respect to amplifier 602 and current mirrors 604 and 606, which are configured with gate-to-drain connections. Under this approach, current mirror 606 requires an additional volt of headroom, which can be provided through the use of a more expensive double-well process, or through charge pumping the substrate of a single well process the full $V_{GS}$ voltage; unfortunately, in this case the associated back-body noise problems result.

However, with a less expensive single well process, using an additional volt of headroom could cause forward-biasing of the NMOS source-to-substrate junctions, or forward-biasing of the PMOS junctions in an n-type substrate. To implement the chopper stabilized current mirror 504 and 506, operational amplifier circuit 500 suitably includes the implementation of current mirrors 504 and 506 in the feedback path of amplifier 503. Moreover, instead of gate-drain connected current mirrors 604 and 606 as illustrated in FIG. 6, current mirror circuits 504 and 506 are not gate-drain connected, but instead are connected through a feedback arrangement as described above. As a result, current mirrors 504 and 506, and their headroom requirements, are incorporated within the requirements of amplifier 503, thus requiring much lower $V_{DS}$ voltage.

In other words, operational amplifier circuit 500 can be suitably configured such that current mirror 504 can be suitably charge pumped a fraction of the $V_{BE}$ voltage. For example, by incorporating current mirror 504 into the feedback path of amplifier 502, the p-substrate can be suitably grounded, thus avoiding potential back-body noise coupling. Accordingly, rather than requiring the negative charge pump to charge pump the operational amplifier output stage current mirror negative for a full $V_{GS}$ voltage, the integrated current mirror enables the charge pump to only charge pump the output mirror device negative by approximately ½ $V_{BE}$ voltage, e.g., to 0.375 volts, so that the NMOS source-substrate diffusions are not forward-biased. As a result, the current mirror requires less $V_{DS}$ voltage to obtain full rail-to-rail output performance.

Figure 8:
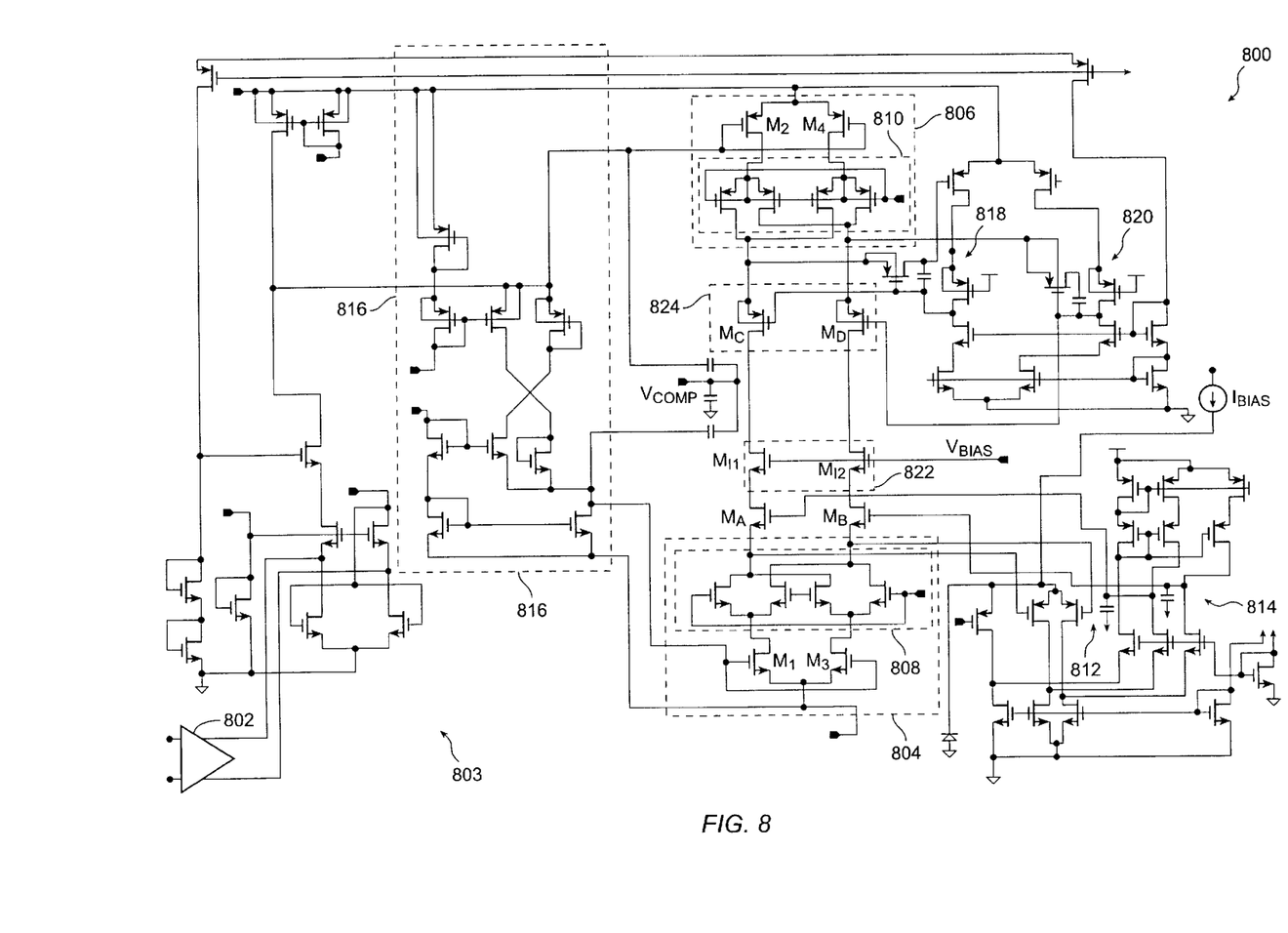
FIG. 8 illustrates a schematic diagram of another exemplary embodiment of an operational amplifier with an integrated current mirror in accordance with the present invention.

Having described various features in accordance with an exemplary embodiment of an operational amplifier circuit 500, another more detailed exemplary operational amplifier circuit 800 can be described with reference to FIG. 8. Operational amplifier circuit 800 suitably comprises an amplifier 803 and a pair of integrated current mirrors 804 and 806. Amplifier 803 comprises a gain stage 802, a class AB biasing network 816, and output devices from within pair of integrated current mirrors 804 and 806. Operational amplifier circuit 800 also comprises switching circuits 808 and 810, cascode devices $M_A$, $M_B$, $M_C$ and $M_D$, and cascode amplifiers 812, 814 and 818 and 820. While gain stage 802 can comprise various amplifier configurations, in accordance with this exemplary embodiment, gain stage 802 comprises a differential amplifier such as gain stage 502 illustrated in FIG. 5. Further, gain stage 802 can be chopper stabilized as described above, e.g., as disclosed in U.S. patent application No. 10/123,981, filed on Apr. 16, 2002, having common inventor and assignee as this application, and incorporated herein by reference.

Output devices for amplifier 803 can be suitably provided from within integrated current mirrors 804 and 806. Current mirrors 804 and 806 can also be suitably configured with switch networks 808 and 810, respectively, to provide for chopper stabilization to minimize and/or reduce mismatch errors between the transistors $M_1$ and $M_3$ and transistors $M_2$ and $M_4$. Further, current mirrors 804 and 806 are suitably configured within the feedback path of amplifier 803, thus requiring less headroom while still providing full rail-to-rail output, i.e., requiring significantly less than the full $V_{GS}$ voltage, to obtain the desired full rail-to-rail output performance.

In addition, cascode devices $M_A$ and $M_B$, are suitably configured to force the voltages across transistors $M_1$ and $M_3$ to be approximately equal. In accordance with an exemplary embodiment, cascode devices $M_A$ and $M_B$ are suitably configured with amplifier devices 812 and 814 respectively, that are configured to drive the sources of each of cascode devices $M_A$ and $M_B$ to a reference voltage $V_R$. As a result, the voltages across transistors $M_1$ and $M_3$ can be forced to approximately equal values, thereby reducing mismatch error between transistors $M_1$ and $M_3$.

In addition to the above devices, operational amplifier circuit 800 can also be configured to reduce the effects of impact ionization that can be present within circuit 800. For example, with additional reference to FIG. 8, it is desirable that any current flowing within the drains of transistors $M_1$, $M_3$, $M_A$ and $M_B$ to flow out the respective sources of each transistor. However, in the event that the voltage from the drain-to-source of each transistor gets too high, leakage current can occur that flows into the p-substrate, thus producing errors. In accordance with an exemplary embodiment, operational amplifier circuit 800 suitably comprises impact ionization circuit 822 that is configured to limit the impact ionization. Impact ionization 822 suitably comprises transistor $M_{11}$, and a transistor device $M_{12}$ suitably coupled to cascode devices $M_A$ and $M_B$.

Accordingly, the exemplary chopper stabilized current mirror can be suitably implemented within the operational amplifier circuit to facilitate true rail-to-rail output operation without requiring significant headroom.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by implementing BJT or JFET devices for the current mirror or cascode devices. Further, the various exemplary embodiments can be implemented with other types of operational amplifier circuits in addition to the circuits illustrated above. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. An operational amplifier circuit configured for increasing rail-to-rail output performance, said operational amplifier circuit comprising:

an amplifier having a gain stage configured for receiving an input signal and having an output stage configured for providing an amplifier output signal;

a first current mirror circuit comprising a first transistor and a second transistor, said first current mirror circuit having an output device integrated within said output stage of said amplifier;

a second current mirror circuit comprising a third transistor and a fourth transistor, said second current mirror circuit having an output device integrated within said output stage of said amplifier; and wherein said first current mirror circuit and said second current mirror circuit are configured to mirror said input signal to provide said amplifier output signal for driving a load;

said amplifier further comprising an output biasing network within said output stage and configured between said gain stage and said output devices of said first current mirror circuit and said second current mirror circuit; and a first switch network coupled to said first current mirror circuit, and a second switch network coupled to said second current mirror circuit, wherein said first switch network and said second switch network are configured to provide chopper stabilization within a feedback loop to said first current mirror circuit and said second current mirror circuit.

2. An operational amplifier circuit according to claim 1, wherein said operational amplifier circuit further comprises:

first switch network being configured to permit said first transistor to drive a first voltage output terminal and to permit said second transistor to drive a second voltage output terminal during a first phase of operation, and to permit said second transistor to drive said first voltage output terminal and to permit said first transistor to drive said second voltage output terminal during a second phase of operation; and said second switch network being configured to permit said third transistor to drive said first voltage output terminal and to permit said fourth transistor to drive said second voltage output terminal during said first phase of operation, and to permit said fourth transistor to drive said first voltage output terminal and to permit said third transistor to drive said second voltage output terminal during said second phase of operation; and wherein said first switch network and said second switch network facilitate reduction of mismatch errors between transistors of at least one of said first current mirror circuit and said second current mirror circuit.

3. An operational amplifier circuit according to claim 2, wherein said first output voltage terminal is coupled back to an inverting input terminal of said gain stage.

4. An operational amplifier circuit according to claim 2, wherein said first transistor and said second transistor have gates coupled to said output biasing network, sources coupled together, and drains alternately coupled through said first switch network to one of said first output voltage terminal and said second output voltage terminal.

5. An operational amplifier circuit according to claim 4, wherein said third transistor and said fourth transistor have gates coupled to said output biasing network, sources connected together, and drains alternately coupled through said second switch network to one of said first output voltage terminal and said second output voltage terminal.

6. An operational amplifier circuit according to claim 2, wherein said output biasing network comprises a class AB biasing network coupled to gates of said first transistor, said second transistor, said third transistor and said fourth transistor and to said gain stage, said AB biasing network being configured to provide biasing to said output stage.

7. An operational amplifier circuit according to claim 2, wherein said amplifier circuit further comprises:

a first pair of cascode devices coupled between said first output voltage terminal and said second output voltage terminal and said first switch network, said first pair of cascode devices being configured to minimize output impedance differences and improve matching between said first transistor and said second transistor; and a second pair of cascode devices coupled between said first output voltage terminal and said second output voltage terminal and said second switch network, said second pair of cascode devices being configured to minimize output impedance differences and improve matching between said third transistor and said fourth transistor.

8. A chopper stabilized current mirror configuration comprising:

a first integrated current mirror circuit comprising a first transistor and a second transistor, said first transistor and said second transistor having gates connected together and having sources coupled together;

a first switch network coupled to drains of said first transistor and said second transistor, said first switch network configured for chopper stabilizing said first transistor and said second transistor;

a second integrated current mirror circuit comprising a third transistor and a fourth transistor, said third transistor and said fourth transistor having gates connected together and having sources coupled together;

a second switch network coupled to drains of said third transistor and said fourth transistor, said second switch network configured for chopper stabilizing said third transistor and said fourth transistor; and wherein said first switch network and said second switch network are configured to permit said first transistor and said third transistor to drive current to a first output terminal and said second transistor and said fourth transistor to drive current to a load device during a first phase of operation, and are configured to permit said second transistor and said fourth transistor to drive current to said first output terminal and said first transistor and said third transistor to drive current to the load device during a second phase of operation.

9. The chopper stabilized current mirror configuration according to claim 8, wherein said chopper stabilized current mirror configuration further comprises:

a first pair of cascode devices coupled between said first output terminal and the load device and said first switch network, said first pair of cascode devices being configured to force voltages across said first transistor and said second transistor to be approximately equal; and a second pair of cascode devices coupled between said first output terminal and the load device and said second switch network, said second pair of cascode devices being configured to force voltages across said third transistor and said fourth transistor to be approximately equal.

10. The chopper stabilized current mirror configuration according to claim 8, wherein said first current mirror circuit comprise NMOS devices, and said second current mirror circuit comprise PMOS devices.

11. The chopper stabilized current mirror configuration according to claim 8, wherein said first current mirror circuit and said first switch network can be configured in a feedback arrangement with an amplifier to permit the amplifier circuit to obtain full rail-to-rail output performance by charge pumping said first integrated current mirror circuit and said second integrated current mirror circuit by at least approximately ½ $V_{BE}$.

12. An integrated circuit comprising:

an amplifier having a gain stage and an output stage;

a current mirror having a first transistor and a second transistor, said current mirror integrated within said output stage of said amplifier such that at least one of said first transistor and said second transistor comprises an output transistor and another of said first transistor and said second transistor comprises a mirroring device for said amplifier, wherein current from said output transistor is mirrored through said mirroring device to a load;

a second current mirror having a third transistor and a fourth transistor, said second current mirror integrated within said output stage of said amplifier such that at least one of said third transistor and said fourth transistor comprise a second output transistor and another of said third transistor and said fourth transistor comprises a second mirroring device for said amplifier, wherein current from said second output transistor is mirrored through said second mirroring device to said load; and a first switch network coupled to drains of said first transistor and said second transistor, said first switch network configured for chopper stabilizing said first transistor and said second transistor, said first switch network configured to permit said first transistor to drive current to a first output terminal and to permit said second transistor to drive current to a load device during a first phase of operation, and configured to permit said second transistor to drive current to said first output terminal and said first transistor to drive current to the load device during a second phase of operation.

13. An integrated circuit according to claim 12, said amplifier further comprising an output biasing network configured between said gain stage and said output stage.

14. An amplifier circuit configured for providing full rail-to-rail output performance, said amplifier circuit comprising:

an amplifier having a gain stage configured for receiving an input signal;

at least one current mirror configuration integrated within said amplifier, said at least one current mirror comprising a first transistor device and a second transistor device; and at least one switching network, said at least one switching network configured such that said first transistor device is coupled in a feedback arrangement with said amplifier and said second transistor device is configured to mirror said input signal to an output load during a first phase, and said second transistor device is coupled in a feedback arrangement with said amplifier and said first transistor device is configured to mirror said input signal to the output load during a second phase.

15. The amplifier circuit according to claim 14, wherein said at least one current mirror configuration comprises a first current mirror configuration comprising said first transistor device and said second transistor device, and said at least one switching network comprises a first switching network, and wherein said amplifier circuit further comprises:

a second current mirror configuration integrated within said amplifier, said second current mirror comprising a third transistor device and a fourth transistor device; and a second switching network configured such than said third transistor device is coupled in a feedback arrangement with said amplifier and said fourth transistor device is configured to mirror said input signal to an output load during said first phase, and said fourth transistor device is coupled in a feedback arrangement with said amplifier and said third transistor device is configured to mirror said input signal to the output load during said second phase.

16. An amplifier circuit according to claim 14, wherein said first transistor and said second transistor have gates coupled to an output biasing network, sources connected together, and drains alternately coupled through said first switch network to one of said feedback arrangement and the output load.

17. An amplifier circuit according to claim 16, wherein said third transistor and said fourth transistor have gates coupled to an output biasing network, sources connected together, and drains alternately coupled through said second switch network to one of said feedback arrangement and the output load.

18. An amplifier circuit according to claim 17, wherein said output biasing network further comprises an AB biasing network being configured to provide biasing to said output stage.

19. An amplifier circuit according to claim 15, wherein said amplifier circuit further comprises:

a first pair of cascode devices having a first cascode device coupled to said first switch network in said feedback arrangement, and a second cascode device coupled between the load device and said first switch network, said first pair of cascode devices being configured to minimize output impedance differences and improve matching between said first transistor and said second transistor; and a second pair of cascode devices having a third cascode device coupled to said second switch network in said feedback arrangement, and a fourth cascode device coupled between the load device and said second switch network, said second pair of cascode devices being configured to minimize output impedance differences and improve matching between said third transistor and said fourth transistor.

20. A method for chopper stabilizing a current mirror configuration to facilitate full rail-to-rail output performance in an amplifier circuit, said method comprising the steps of:

receiving an input current signal in an amplifier having an output stage configured within a first current mirror circuit and a second current mirror circuit;

switching a first transistor of said first current mirror circuit and a third transistor of said second current mirror circuit to be in a feedback arrangement with said amplifier during a first phase of operation;

switching a second transistor of said first current mirror circuit and a fourth transistor of said second current mirror circuit to be connected with a load device during said first phase of operation;

switching said second transistor of said first current mirror circuit and said fourth transistor of said second current mirror circuit to be in said feedback arrangement with said amplifier device during a second phase of operation; and switching a first transistor of said first current mirror circuit and a third transistor of said second current mirror circuit to be connected with the load device during said first phase of operation.

* * * * *

UNITED STATES PATENT AND TRADEMARK OFFICE
CERTIFICATE OF CORRECTION

PATENT NO. : 6,653,894 B2
DATED : November 25, 2003
INVENTOR(S) : Thomas L Botker It is certified that error appears in the above-identified patent and that said Letters Patent is hereby corrected as shown below:

Title page,
Item [22], Filed, change date from "April 18, 2002" to -- April 19, 2002 --.

Signed and Sealed this

Twenty-ninth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,653,894 B2
DATED         : November 25, 2003
INVENTOR(S)   : Thomas L. Botker It is certified that error appears in the above-identified patent and that said Letters Patent is hereby corrected as shown below:

<u>Title page,</u>
Item [73], Assignee, should read -- Texas Instruments Inc., Dallas, TX. --
Item [22], PCT Filed, change date from "April 18, 2002" to -- April 19, 2002 --.

Signed and Sealed this

Ninth Day of November, 2004

JON W. DUDAS
*Director of the United States Patent and Trademark Office*